United States Patent
Makabe

(10) Patent No.: US 8,070,242 B2
(45) Date of Patent: Dec. 6, 2011

(54) MOUNTING UNIT AND ELECTRONIC APPARATUS

(75) Inventor: Eiji Makabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1009 days.

(21) Appl. No.: 11/387,764

(22) Filed: Mar. 24, 2006

(65) Prior Publication Data

US 2007/0223204 A1    Sep. 27, 2007

(51) Int. Cl.
*A47B 81/00* (2006.01)

(52) U.S. Cl. .................................... 312/223.1

(58) Field of Classification Search ............... 312/223.1, 312/223.2, 257.1, 334.1; 361/724, 725, 726, 361/727; 211/26, 41.17; 248/297.21, 298.1; 16/444, 405
See application file for complete search history.

(56) References Cited

U.S. PATENT DOCUMENTS

| | | | |
|---|---|---|---|
| 337,412 A * | 3/1886 | Long | 16/415 |
| 401,832 A * | 4/1889 | Hartman | 16/429 |
| 2,069,255 A * | 2/1937 | Lifton | 190/115 |
| 2,986,281 A * | 5/1961 | Jordan | 211/41.17 |
| 3,113,651 A * | 12/1963 | Szabo et al. | 16/405 |
| 3,447,195 A * | 6/1969 | Bush | 16/405 |
| 4,632,242 A * | 12/1986 | Choi et al. | 206/45.24 |
| 5,045,960 A * | 9/1991 | Eding | 360/97.01 |
| 5,130,887 A * | 7/1992 | Trelford | 361/679.02 |
| 5,317,795 A * | 6/1994 | Bolton et al. | 29/434 |
| 5,530,620 A * | 6/1996 | Sangveraphunsiri | 361/679.33 |
| 6,115,258 A * | 9/2000 | Hoyle et al. | 361/752 |
| 6,195,259 B1 * | 2/2001 | Whitman et al. | 361/725 |
| 6,282,097 B1 * | 8/2001 | Minelli et al. | 361/728 |
| 6,288,911 B1 * | 9/2001 | Aoki et al. | 361/801 |
| 6,373,698 B1 * | 4/2002 | Christensen | 361/695 |
| 6,389,645 B1 * | 5/2002 | Polidoro | 16/405 |
| 6,411,517 B1 * | 6/2002 | Babin | 361/759 |
| 6,426,876 B1 * | 7/2002 | Shearman et al. | 361/726 |
| 6,449,171 B1 * | 9/2002 | Karnes | 361/796 |
| 6,462,959 B1 * | 10/2002 | Fu et al. | 361/801 |
| 6,480,391 B1 * | 11/2002 | Monson et al. | 361/752 |
| 6,484,364 B2 * | 11/2002 | Turner | 16/443 |
| 6,556,437 B1 * | 4/2003 | Hardin | 361/679.48 |
| 6,665,908 B1 * | 12/2003 | Mease | 16/422 |
| 6,856,508 B2 * | 2/2005 | Rabinovitz | 361/679.31 |
| 7,079,381 B2 * | 7/2006 | Brehm et al. | 361/679.33 |
| 2003/0021091 A1 * | 1/2003 | Robbins et al. | 361/727 |
| 2006/0091767 A1 * | 5/2006 | Chaloner et al. | 312/223.2 |

* cited by examiner

*Primary Examiner* — James O Hansen
*Assistant Examiner* — Matthew Ing
(74) *Attorney, Agent, or Firm* — Kratz, Quintos & Hanson, LLP

(57) ABSTRACT

First and second guiding rails are attached to support member in a mounting unit. The mounting unit is mounted in an enclosure of an electronic apparatus, for example. The second guiding rail at a first position extends straight on the extension of the first guiding rail. The first and second guiding rails serve to assist the insertion of the mounting unit into the enclosure. The second guiding rail at a second position serves to define a window opening with the assistance of the edge of the support member. A supervisor is allowed to insert fingers into the window opening. The second guiding rail functions as a handle. The second guiding rail in this manner serves to assist the carriage of the mounting unit. A space is not required solely for a handle separately from a space for a guiding rail in the mounting unit. The mounting unit is thus allowed to efficiently utilize its inside space.

2 Claims, 8 Drawing Sheets

MOUNTING UNIT AND ELECTRONIC APPARATUS

BACKGROUND OF THE INVENTION

1. Field of the Invention

The present invention relates to a mounting unit mounted on an electronic apparatus such as a server computer.

2. Description of the Prior Art

An input/output unit is mounted in the enclosure of a server computer, for example. A PCI board is incorporated in the input/output unit, for example. A handle is utilized to carry the input/output unit. Such a handle is attached to the top plate of the input/output unit, for example. The top plate defines a depression for receiving the handle.

The handle is kept at an upright attitude in the depression during the carriage. The handle falls down from the upright attitude when the input/output unit is mounted in the enclosure. The handle is laid down into the depression. The handle is of no use when the input/output unit has been mounted in the enclosure. The handle inevitably occupies some space within the input/output unit mounted in the enclosure.

SUMMARY OF THE INVENTION

It is accordingly an object of the present invention to provide a mounting unit and an electronic apparatus both capable of contributing to an efficient use of a space.

According to a first aspect of the present invention, there is provided amounting unit comprising: a support member; a first guiding rail attached to the support member, the first guiding rail extending straight along the edge of the support member; and a second guiding rail attached to the support member, the second guiding rail displaced between a first position and a second position, the second guiding rail at the first position extending straight on the extension of the first guiding rail, the second guiding rail at the second position defining a window opening in cooperation with the edge of the support member.

The mounting unit is mounted within the enclosure of an electronic apparatus, for example. The second guiding rail at the first position extends straight on the extension of the first guiding rail. The first and second guiding rails serve to guide the insertion of the mounting unit into the enclosure. On the other hand, the second guiding rail is allowed to displace from the first position to the second position. The window opening is defined between the edge of the support member and the second guiding rail at the second position. A management of the mounting unit can put his/her fingers into the window opening, for example. The second guiding rail is in this manner utilized as a handle. The second guiding rail can be utilized during carriage of the mounting unit. A space is not required for a handle separately from a space for a guiding rail within the mounting unit. The mounting unit is thus allowed to efficiently utilize its inside space.

Specifically, the second guiding rail also serves as a handle, so that some space for the handle in a conventional mounting unit can be a space for other component or components. The mounting unit is thus allowed to enjoy an enhanced flexibility of arrangement for the components within the mounting unit. In addition, the second guiding rail is pulled out from the upper edge of the support member. The mounting unit is thus prevented from getting larger in size.

The mounting unit may further comprise a front panel coupled to the support member. In this case, the second guiding rail may be attached to the support member at a position closer to the front panel relative to the first guiding rail. The second guiding rail can be utilized as a handle until the mounting unit is sufficiently guided into the enclosure along the first guiding rail during the insertion of the mounting unit into the enclosure of the electronic apparatus. The mounting unit can be mounted within the enclosure in a facilitated manner.

The mounting unit may be incorporated in an electronic apparatus as described above. The electronic apparatus may comprise: an enclosure; a guiding member formed in the enclosure; and a mounting unit mounted in the enclosure along the guiding member. In this case, the mounting unit may comprise: a support member; a first guiding rail attached to the support member, the first guiding rail guided along the guiding member; and a second guiding rail attached to the support member, the second guiding rail displaced between a first position and a second position, the second guiding rail at the first position extending straight on the extension of the first guiding rail, the second guiding rail at the second position defining a window opening in cooperation with the edge of the support member. The electronic apparatus is allowed to enjoy the aforementioned advantages.

According to a second aspect of the present invention, there is provided a mounting unit comprising: a support member; and a displacement member attached to the support member, the displacement member displaced between a first position and a second position, the displacement member at the first position serving as a guiding rail, the displacement member at the second position serving as a handle. The mounting unit is mounted within the enclosure of an electronic apparatus, for example. The displacement member serves as a guiding rail at the first position. The guiding rail serves to assist the insertion of the mounting unit into the enclosure. On the other hand, the displacement member also serves as a handle at the second position. The displacement member allows carriage of the mounting unit. A space is not required for a handle separately from a space for a guiding rail within the mounting unit. The mounting unit is thus allowed to efficiently utilize its inside space.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
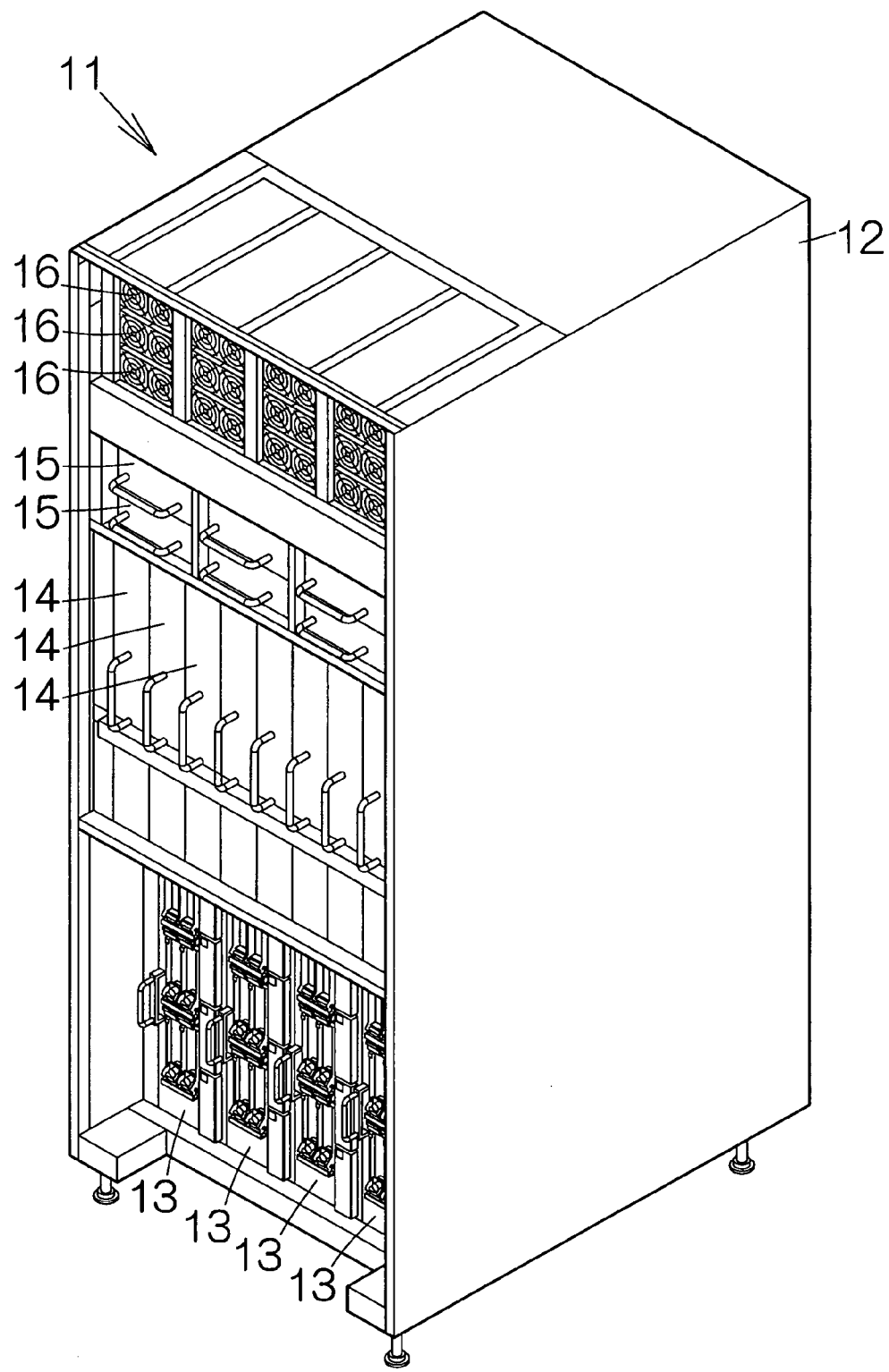
FIG. 1 is a perspective view schematically illustrating a server computer as a specific example of an electronic apparatus according to an embodiment of the present invention.

FIG. 1 schematically illustrates a server computer 11 as a specific example of an electronic apparatus according to an embodiment of the present invention. The server computer 11 includes an enclosure 12. Mounting units, namely input/output units 13, are mounted on the lower rack of the enclosure 12. The input/output units 13 are inserted into the enclosure 12 from the front. A back panel is placed within the enclosure 12. The input/output units 13 are coupled to the back panel. Connectors are employed for the coupling, for example. The input/output units 13 will be described later in detail.

System board units 14 are mounted on the middle rack of the enclosure 12. System boards are incorporated in the respective system board units 14. The system boards stand upright in the vertical direction perpendicular to the floor within the enclosure 12. Electronic circuit elements such as a central processing unit (CPU), a memory, and the like, are mounted on the individual system board, for example. The CPU executes various kinds of processing based on software programs and/or data temporarily stored in the memory, for example. The system board units 14 are coupled to the aforementioned back panel. Connectors are employed for the coupling, for example.

Fan units 15 are mounted on the upper rack of the enclosure 12. The individual fan unit 15 includes axial flow fans, for example. The fan unit 15 generates airflow within the enclosure 12 based on the rotation of the rotor in the individual axial flow fan. The rotation axes of the rotors extend in the vertical direction perpendicular to the floor. The generated airflow thus runs in the vertical direction from the bottom of the enclosure 12 toward the top of the enclosure 12. The airflow thus absorbs heat from the input/output units 13 and the system board units 14.

Power source units 16 are mounted on the top rack of the enclosure 12 to supply electric supply to each part of the server computer 11. The server computer 11 is provided with a cable coupled to an outlet. The power source units 16 serves to transform the alternating current (AC) supplied from the outlet into the direct current (DC). The direct current is supplied to the fan units 15 and the aforementioned back panel. The direct current is supplied to the input/output units 13 and the system board units 14 through the back panel.

Figure 2:
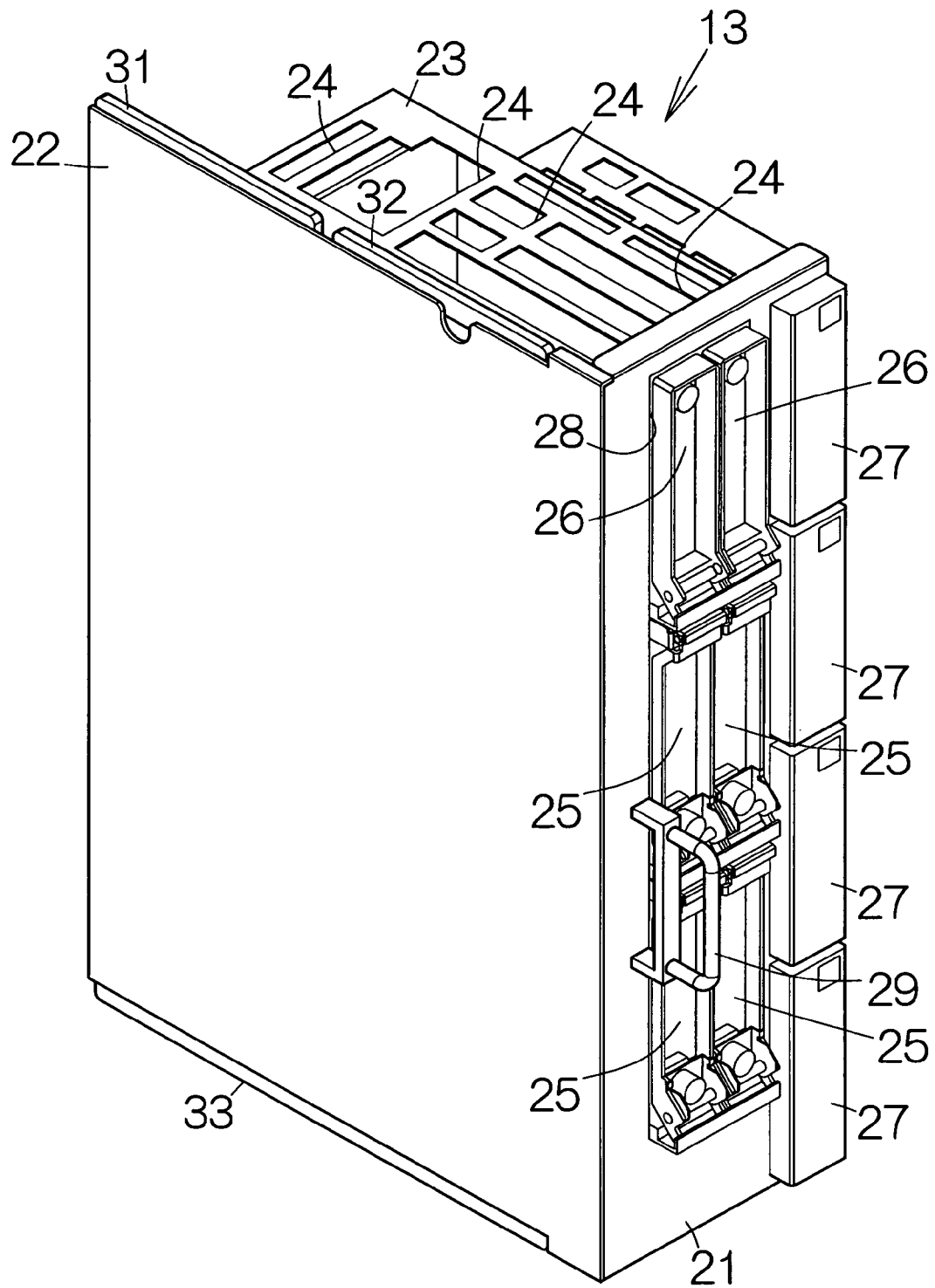
FIG. 2 is a perspective view schematically illustrating an input/output unit as a specific example of a mounting unit according to the present invention.

FIG. 2 is a perspective view schematically illustrating the input/output unit 13 according to an embodiment of the present invention. As shown in FIG. 2, a front panel 21 is placed at the front end of the input/output unit 13. A support member, namely a side panel 22, is placed at the side of the input/output unit 13. The front edge of the side panel 22 is coupled to the side edge of the front panel 21, for example. The side panel 22 is set perpendicular to the front panel 21. The front and side panels 21, 22 take upright attitudes in the direction of gravity or in the vertical direction. The upper and lower edges of the side panel 22 extend in parallel with each other.

A top plate 23 is placed at the top of the input/output unit 13. The top plate 23 may be attached to both the front and side panels 21, 22. Openings 24 are formed in the top plate 23, for example. Here, the front panel 21, the side panel 22 and the top plate 23 may be formed out of a metal plate such as a stainless steel-plate, respectively, for example.

PCI adapters 25, board management controller (BMC) adapters 26 and hard disk drives (HDDs) 27 are inserted into the front panel 21. A PCI board is incorporated in the individual PCI adapter 25. A BMC board is incorporated in the individual BMC adapter 26. The BMC board is designed to control the input/output of the partitions of the server computer 11. A window opening 28 is formed in the front panel 21 to accept the insertion of the PCI adapters 25 and the BMC adapters 26. In addition, a grip 29 may be fixed to the front panel 21. The grip 29 extends forward from the front panel 21.

First and second guiding rails 31, 32 are placed at the upper edge of the side panel 22. The first and second guiding rails 31, 32 serve to guide the movement of the input/output unit 13. The input/output unit 13 is inserted into the enclosure 12 with the assistance of the first and second guiding rails 31, 32. Likewise, the input/output unit 13 is withdrawn from the enclosure 12 with the assistance of the first and second guiding rails 31, 32.

The first and second guiding rails 31, 32 are designed to extend straight along the upper edge of the side panel 22. Specifically, the second guiding rail 32 extends on the extension of the first guiding rail 31. The second guiding rail 32 is placed in a space between the front panel 21 and the first guiding rail 31. The first guiding rail 31 is rigidly fixed to the side panel 22. The second guiding rail 32 is mounted on the side panel 22 for a relative movement, as described later in detail. The second guiding rail 32 serves as a displacement member of the present invention.

A third guiding rail 33 is placed at the lower edge of the side panel 22. The third guiding rail 33 likewise serves to guide the movement of the input/output unit 13. The third guiding rail 33 assists the insertion of the input/output unit 13 into the enclosure 12 and the withdrawal of the input/output unit 13 from the enclosure 12, in combination with the first and second guiding rails 31, 32.

The third guiding rail 33 extends straight along the lower edge of the side panel 22. The third guiding rail 33 is set parallel to the first and second guiding rails 31, 32. Here, the third guiding rail 33 may rigidly be fixed to the side panel 22. The first, second and third guiding rails 31, 32, 33 may be made of a resin material such as nylon, for example. Molding process may be employed to form the first, second and third guiding rails 31, 32, 33, for example.

Figure 3:
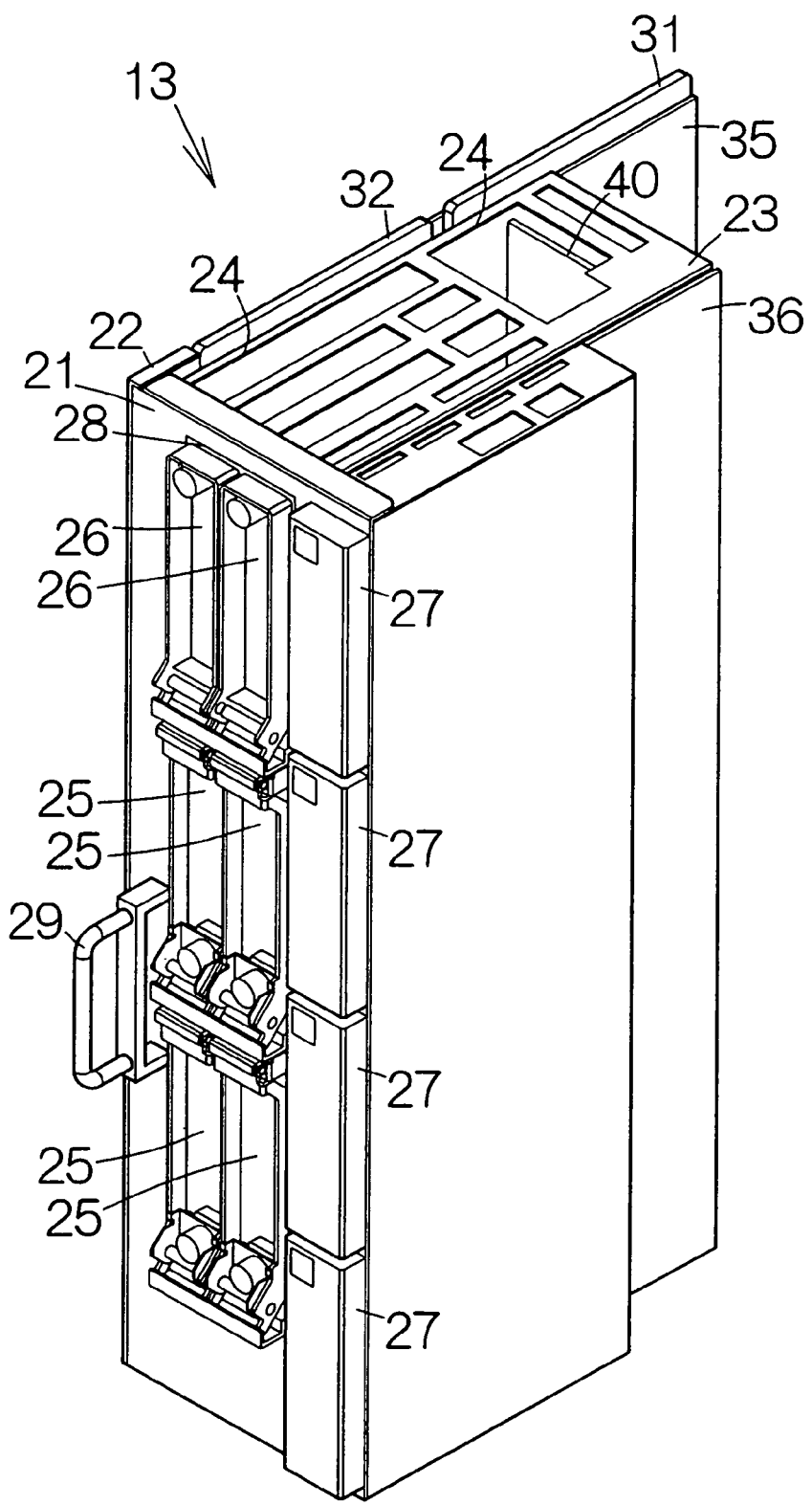
FIG. 3 is a perspective view schematically illustrating the input/output unit.

FIG. 3 is a perspective view of the input/output unit 13 from the different angle. The input/output unit 13 includes first and second printed wiring board 35, 36. The first printed wiring board 35 is superposed on the side panel 22. The second printed wiring board 26 extends in parallel with the first printed wiring board 35. A screw or screws, not shown, may be utilized to fix the first printed wiring board 35 onto the side panel 22, for example. The first printed wiring board 35 is coupled to the aforementioned back panel. A connector may be employed for the coupling, for example. The hard disk drives 27 are mounted on the second printed wiring board 36. The first and second printed wiring boards 35, 36 take an upright attitude in the vertical direction.

A third printed wiring board 40 is placed in a space between the first and second printed wiring board 35, 36. The third printed wiring board 40 is coupled to the first printed wiring board 35 in an attitude upright to the first printed wiring board 35. The aforementioned PCI boards and BMC boards are coupled to the third printed wiring board 40. Connectors may be employed for the coupling, for example. When the input/output unit 13 is mounted on the enclosure 12, the openings 24 of the top plate 23 allow airflow to run along the first, second and third printed wiring boards 35, 36, 40. The airflow serves to absorb heat from electronic circuit elements on the first, second and third printed wiring boards 35, 36, 40.

Figure 4:
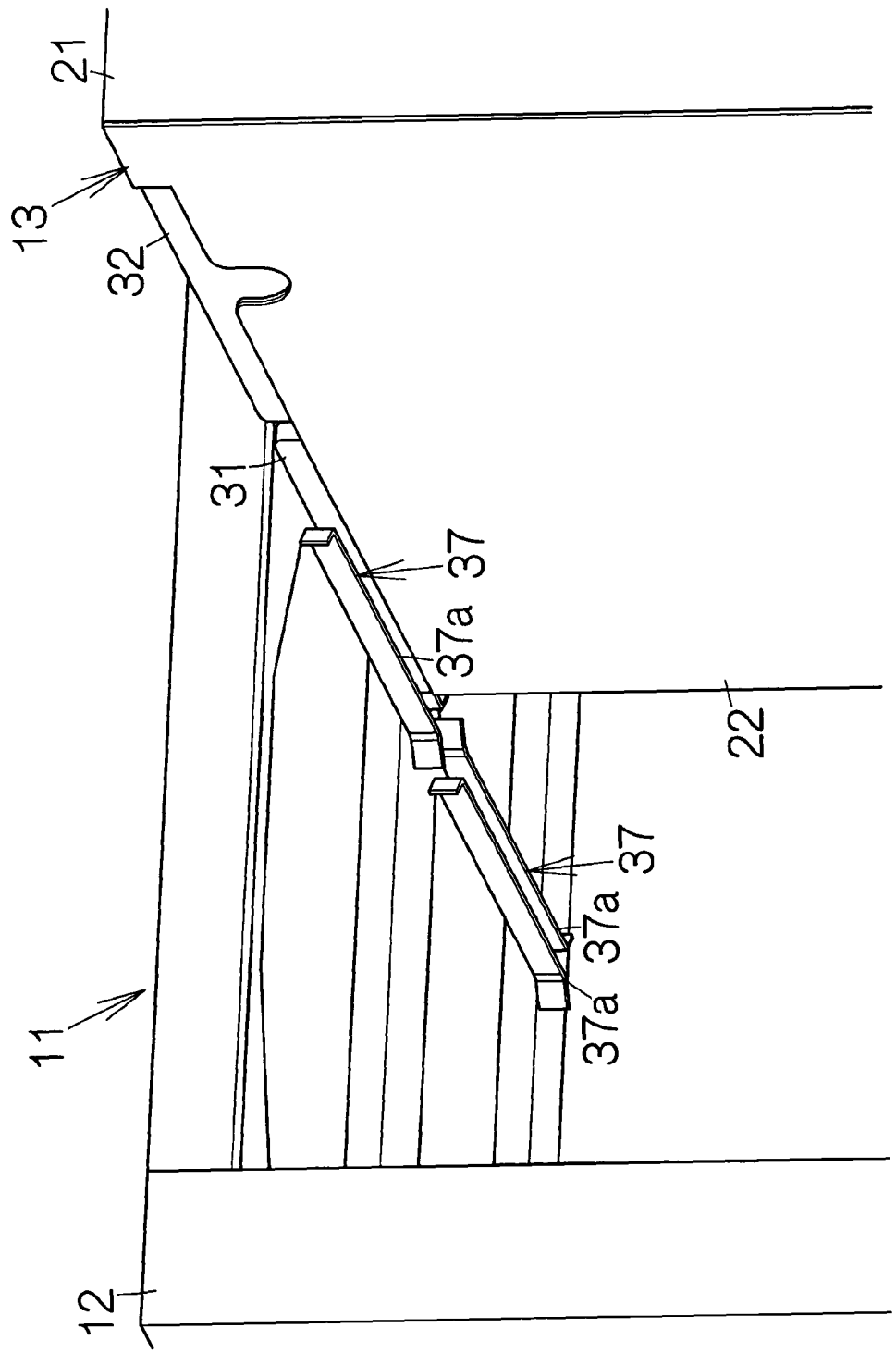
FIG. 4 is a partial enlarged perspective view of the enclosure of the server computer for schematically illustrating the structure of guiding members.

FIG. 4 is a perspective view schematically illustrating the inside of the enclosure 12 and the upper edge of the input/output unit 13. As shown in FIG. 4, the enclosure 12 is provided with serial first guiding members 37, 37. The first guiding members 37, 37 are designed to extend backward in the horizontal direction from the front end near the front of the enclosure 12. The first guiding members 37, 37 extend on a common straight line. The individual first guiding member 37 includes a pair of upstanding walls 37a, 37a opposed to each other. The upstanding walls 37a, 37a extend in parallel with each other. The upstanding walls 37a, 37a define a guideway for the first and second guiding rails 31, 32 of the input/output unit 13.

Figure 5:
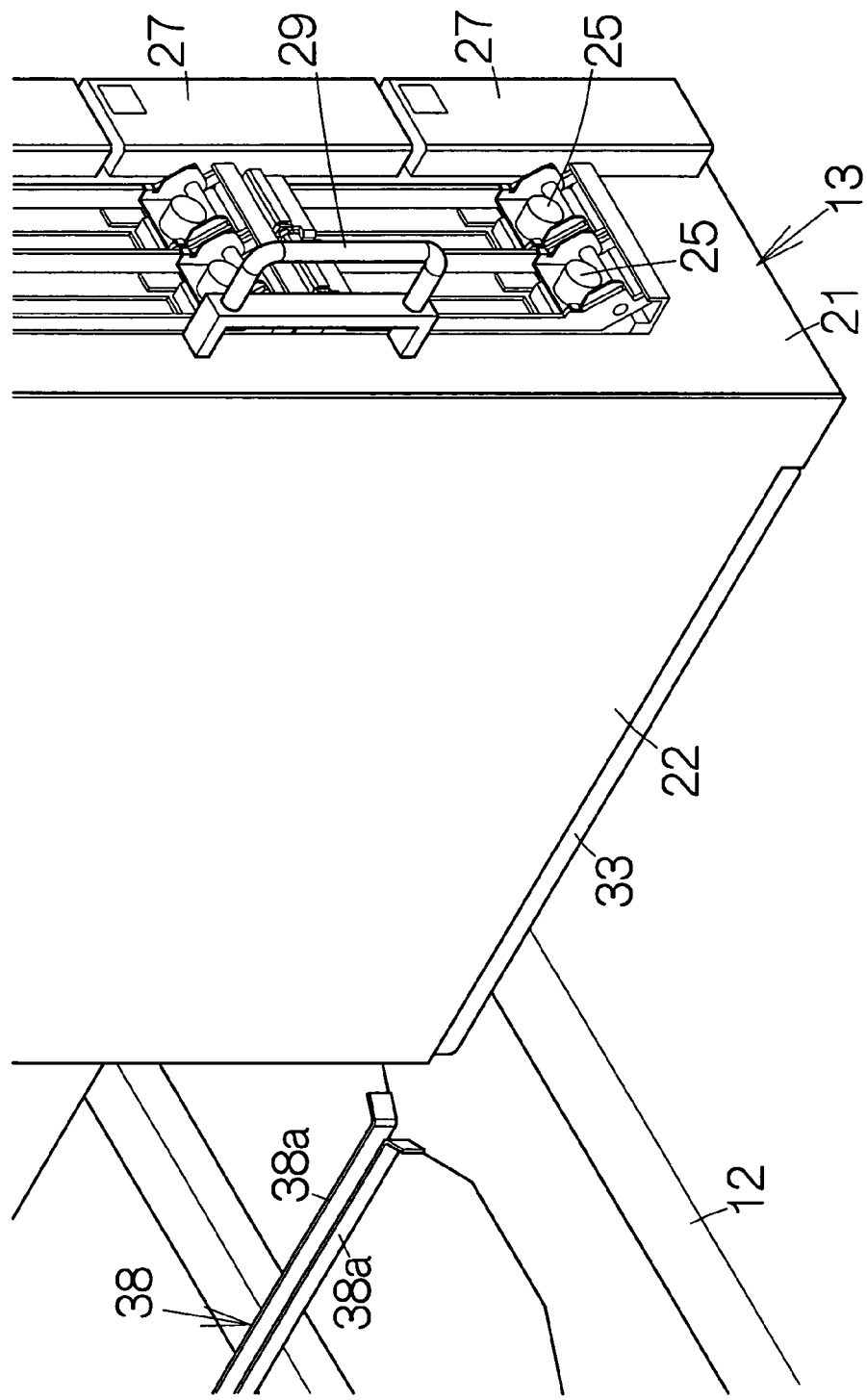
FIG. 5 is a partial enlarged perspective view of the enclosure of the server computer for schematically illustrating the structure of a guiding member.

FIG. 5 is a perspective view schematically illustrating the inside of the enclosure 12 and the lower edge of the input/output unit 13. As shown in FIG. 5, the enclosure 12 is provided with a second guiding member 38. The second guiding member 38 extends backward in the horizontal direction from the front end near the front of the enclosure 12. The second guiding member 38 is designed to extend in parallel with the first guiding members 37, 37 within a plane perpendicular to the floor. The individual second guiding member 38 includes a pair of upstanding walls 38a, 38a opposed to each other. The upstanding walls 38a, 38a extend in parallel with each other. The upstanding walls 37a, 37a define a guideway for the third guiding rail 33 of the input/output unit 13.

The first and second guiding members 37, 38 serve to guide the longitudinal movement of the input/output unit 13 in the horizontal direction in the enclosure 12. The input/output unit 13 moves forward into the enclosure 12 along the first and second guiding members 37, 38 when the input/output unit 13 is inserted into the enclosure 12 from the front. Likewise, the input/output unit 13 moves backward along the first and second guiding members 37, 38 when the input/output unit 13 is removed from the enclosure 12.

Figure 6:
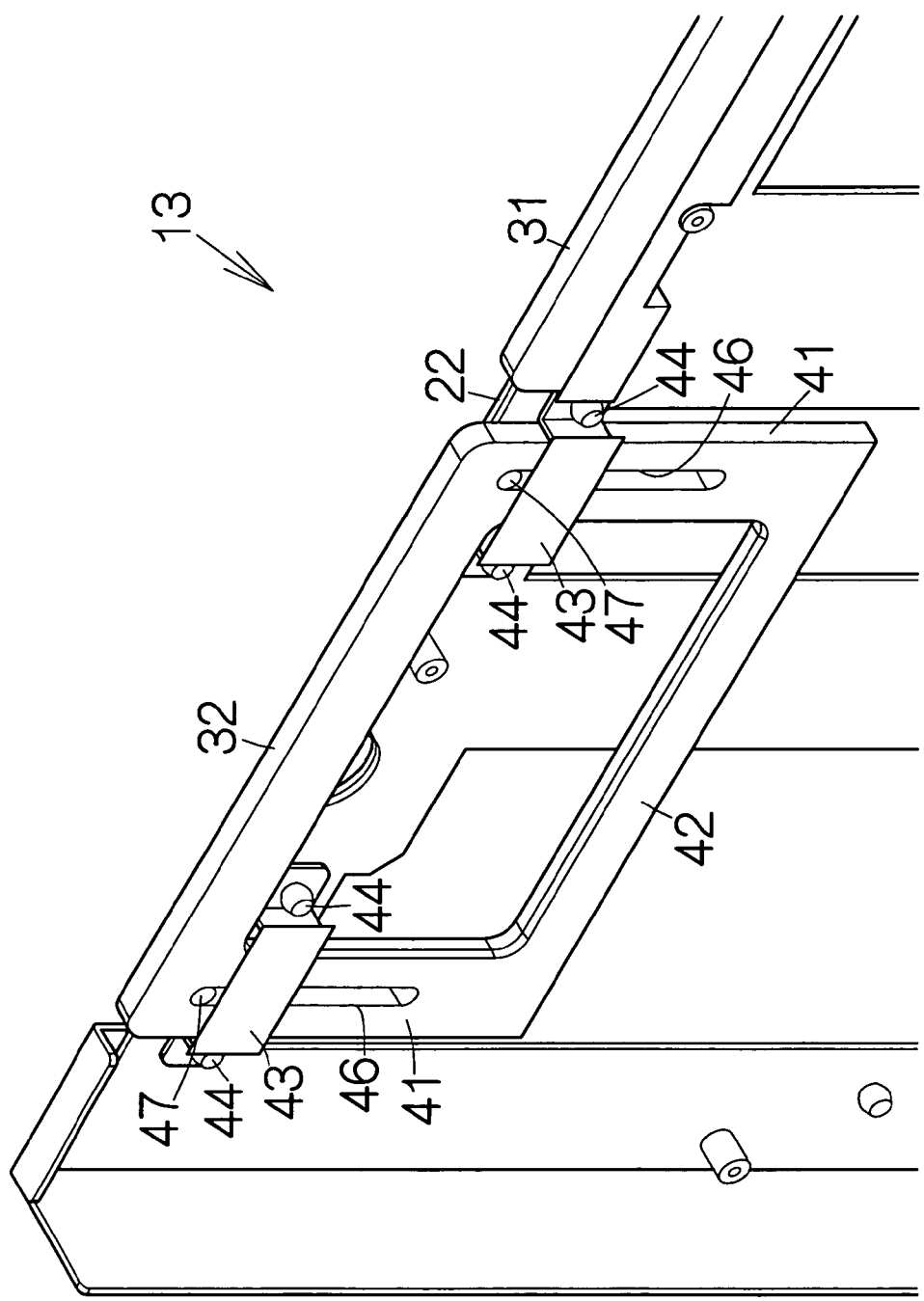
FIG. 6 is a partial enlarged perspective view schematically illustrating the structure of a second guiding rail positioned at a first position.

FIG. 6 is a partial enlarged perspective view of the input/output unit 13 for schematically illustrating the vicinity of the second guiding rail 32. As shown in FIG. 6, a pair of vertical pieces 41, 41 is coupled to the opposite ends of the second guiding rail 32, respectively. The individual vertical piece 41 extends in a direction perpendicular to the second guiding rail 32. The vertical pieces 41, 41 may be parallel to each other. The vertical pieces 41, 41 are designed to extend along the surface of the side panel 22 from the upper edge toward the lower edge of the side panel 22. A connecting piece 42 is connected to the lower ends of the vertical pieces 41, 41. The connecting piece 42 extends along the surface of the side panel 22 in parallel with the second guiding rail 32. The second guiding rail 32, the vertical pieces 41 and the connecting piece 42 in combination form a frame. The second guiding rail 32, the vertical pieces 41 and the connecting piece 42 may be formed in a one piece component. Molding process may be employed to form such a one piece component.

The vertical pieces 41, 41 serve to couple the second guiding rail 32 to the side panel 22. Metallic attachment pieces 43, 43 are utilized to couple the vertical pieces 41, 41 to the side panel 11. The vertical pieces 41, 41 are held between the attachment pieces 43, 43 and the side panel 22, respectively. A predetermined clearance may be established between the individual attachment piece 43 and the corresponding vertical piece 41 as well as between the side panel 22 and the vertical pieces 41. Rivets 44, 44 are utilized to rigidly fix the individual attachment piece 43 to the side panel 22, for example.

An elongated opening 46 is formed in the individual vertical piece 41. The elongated opening 46 is designed to extend in the vertical direction by a predetermined length. Here, the elongated openings 46 are designed to extend in parallel with each other. The individual elongated opening 46 receives a stud 47 standing upright from the surface of the side panel 22. The studs 47 may be formed in a columnar shape, for example. The studs 47 are rigidly fixed to the side panel 22. The elongated openings 46 and the studs 47 in combination serve to guide the movement of the second guiding rail 32.

As is apparent from FIG. 6, when the lower end of the second guiding rail 32 is received on the upper ends of the attachment pieces 43, the second guiding rail 32 is positioned at a first position. The studs 47 receive the upper ends of the elongated openings 46, respectively. The second guiding rail 32 is thus prevented from a further downward movement toward the lower edge of the side panel 22 from the upper edge of the side panel 22. The second guiding rail 32 at the first position is set in series with the first guiding rail 31.

Figure 7:
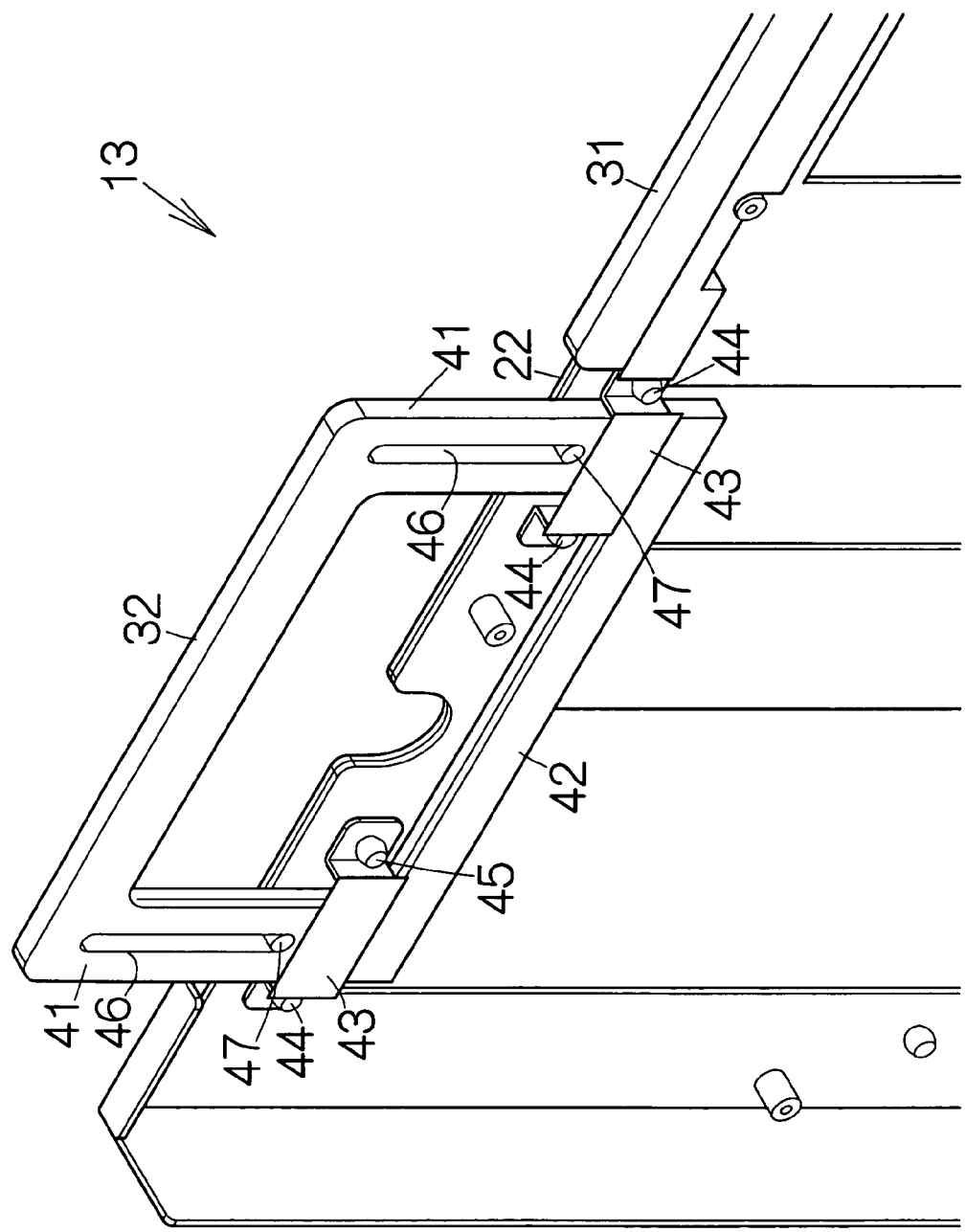
FIG. 7 is a partial enlarged perspective view schematically illustrating the structure of the second guiding rail positioned at a second position.

FIG. 7 is a partial enlarged perspective view of the input/output unit 13 for schematically illustrating the second guiding rail 32 protruding from the upper edge of the side panel 22. When the second guiding rail 32 is lifted up along the surface of the side panel 22, the studs 47 within the corresponding elongated openings 46 serve to guide the movement of the vertical pieces 41. The second guiding rail 32 protrudes from the upper edge of the side panel 22. When the studs 47 respectively contact with the lower ends of the elongated openings 46, the second guiding rail 32 is positioned at a second position. The lower ends of the attachment pieces 43 receive the upper end of the connecting piece 42. The second guiding rail 32 is thus prevented from a further upward movement in the vertical direction above the upper edge of the side panel 22.

Figure 8:
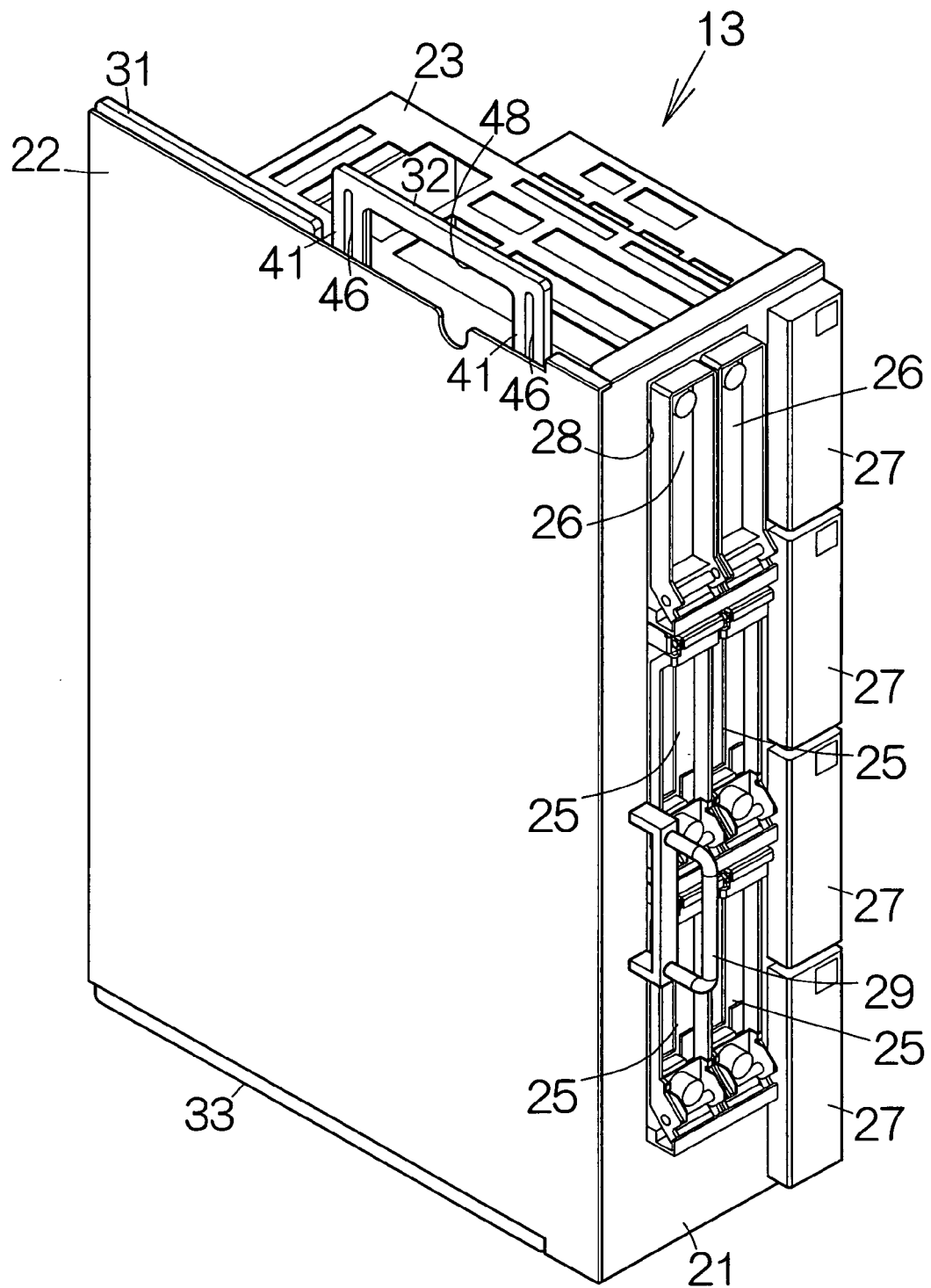
FIG. 8 is a perspective view schematically illustrating the input/output unit.

FIG. 8 is a perspective view of the input/output unit 13 for schematically illustrating the second guiding rail 32 protruding from the upper edge of the side panel 22. As shown in FIG. 8, a window opening 48 is defined between the upper edge of the side panel 22 and the second guiding rail 32 at the second position. A supervisor of the server computer 11 can thus put his/her fingers into the window opening 48, for example. The supervisor is thus allowed to grip the second guiding rail 32. Since the second guiding rail 32 is prevented from the upward movement outward from the upper edge of the side panel 22, the second guiding rail 21 serves as a handle. One may utilize the second guiding rail 32 to carry the input/output unit 13.

The second guiding rail 32 at the first position is received in the first guiding members 37 in the server computer 11. The horizontal movement of the input/output unit 13 is thus guided. On the other hand, the second guiding rail 32 at the second position serves as a handle. A space is not required for a handle separately from a space for a guiding rail within the input/output unit 13. The input/output unit 13 is thus allowed to efficiently utilize its inside space.

Specifically, the second guiding rail 32 also serves as a handle, so that the handle occupies only a reduced space within the input/output unit 13 as compared with a conventional input/output unit. Other component or components can thus be placed in a decrement of the space for a handle within the input/output unit 13. The input/output unit 13 is thus allowed to enjoy an enhanced flexibility of arrangement for the components within the input/output unit 13. In addition, the second guiding rail 32 protrudes from the upper edge of the side panel 22 only when the second guiding rail 32 is utilized as a handle during carriage. The input/output unit 13 is thus prevented from getting larger in size.

The second guiding rail 32 is placed along the surface of the side panel 22. The second guiding rail 32 moves along the surface of the side panel 22. Airflow runs in the vertical direction along the surface of the side panel 22. In addition, a handle needs not be placed along the top plate 23. Airflow of a sufficient amount is allowed to run from the bottom of the input/output unit 13 toward the top of the input/output unit 13. The airflow thus efficiently absorbs heat from the input/output unit 13.

The vertical pieces 41, 41 are coupled to the opposite ends of the second guiding rail 32, respectively. The vertical pieces 41, 41 are connected to each other through the connecting piece 42. The connecting piece 42 serves to surely prevent the vertical pieces 41, 41 from deformation to the utmost. Even if the overall weight of the input/output unit 13 acts on the second guiding rail 32 during carriage of the input/output unit 13, the connecting piece 42 serves to prevent the second guiding rail 32 from deformation. The second guiding rail 32 can thus be made of a light resin material such as nylon, for example.

The second guiding rail 32 is placed at a position closer to the front panel 21 as compared with the first guiding rail 31. The second guiding rail 32 can be utilized as a handle until the first and third guiding rails 31, 33 are sufficiently guided along the first and second guiding members 37, 38 during the insertion of the input/output unit 13 into the enclosure 12. The input/output unit 13 can be mounted on the enclosure 12 in a facilitated manner. The second guiding rail 32 may then be returned to the first position. The second guiding rail 32 can thus be received in the first guiding members 37.

The present invention can be applied to a mounting unit other than the aforementioned input/output unit 13. Likewise, an electronic apparatus receiving a mounting unit such as the input/output unit 13 or the like may include any electronic apparatus other than the server computer 11.

What is claimed is:

1. An electronic apparatus comprising:
an enclosure;
a guiding member formed in the enclosure; and
a mounting unit mounted in the enclosure along the guiding member, wherein
the mounting unit comprising:
a support member;
a first guiding rail attached to the support member, the first guiding rail guided along the guiding member;
a second guiding rail displaced between a first position and a second position, the second guiding rail at the first position extending straight on an extension line of the first guiding rail so as to cooperate with the first guiding rail to function as a serial continuous guiding rail, the second guiding rail at the second position being spaced in a direction perpendicular to the extension line from the extension line along an edge of the support member; and
a pair of vertical pieces coupled to the opposite ends of the second guiding rail so as to extend in a direction perpendicular to the second guiding rail, the vertical pieces attached to the support member so as to guide movement of the second guiding rail between the first position and the second position, the vertical pieces defining a window opening outside the support member between the vertical pieces and between the edge of the support member and the second guiding rail at the second position.

2. The electronic apparatus according to claim 1, wherein the mounting unit further comprises a front panel coupled to the support member, the second guiding rail is attached to the support member at a position closer to the front panel relative to the first guiding rail.

* * * * *